(12) United States Patent
Bommier

(10) Patent No.: US 6,334,898 B1
(45) Date of Patent: Jan. 1, 2002

(54) CRUCIBLE HOLDER FOR PULLING MONOCRYSTALS

(75) Inventor: Christophe Bommier, Basking Ridge, NJ (US)

(73) Assignee: Le Carbone Lorraine, Courbevoie (FR)

( * ) Notice: Subject to any disclaimer, the term of this patent is extended or adjusted under 35 U.S.C. 154(b) by 0 days.

(21) Appl. No.: 09/514,374

(22) Filed: Feb. 28, 2000

(30) Foreign Application Priority Data

Jan. 20, 2000 (FR) ............................................. 00 00722
Feb. 24, 2000 (FR) ............................................. 00 02332

(51) Int. Cl.⁷ ............................................. C30B 35/00
(52) U.S. Cl. ..................... 117/200; 117/208; 117/900
(58) Field of Search ................................ 117/200, 208, 117/213, 900

(56) References Cited

U.S. PATENT DOCUMENTS

H520 * 9/1988 Johnson et al. ............. 117/200
5,372,090 A 12/1994 Wegmeth et al.

FOREIGN PATENT DOCUMENTS

| DE | 4325522 | 11/1994 | |
|----|---------|---------|---|
| GB | 2188854 A | * 10/1987 | .................. 117/900 |
| JP | 03-228892 | 10/1991 | |
| JP | 04-321584 | 11/1992 | |
| JP | 06-345587 | 12/1994 | |
| JP | 11-171682 | 6/1999 | |

* cited by examiner

Primary Examiner—Felisa Hiteshew
(74) Attorney, Agent, or Firm—Dennison, Scheiner, Schultz & Wakeman

(57) ABSTRACT

A crucible holder made of a carbon material for use in crystal pulling operations and in the shape of a hollow receptacle. The holder includes at least two distinct and complementary parts that can be brought together by junction surfaces. When the parts are assembled to form the crucible holder, specific portions of the junction surfaces overlap to form at least one overlap area. The crucible holder can limit chemical reactions between the crucible and the holder and prolong the lives of both.

16 Claims, 8 Drawing Sheets

CRUCIBLE HOLDER FOR PULLING MONOCRYSTALS

FIELD OF THE INVENTION

This invention relates to devices to be used for the production of monocrystalline ingots by pulling from a molten bath, particularly the production of monocrystalline silicon ingots using the Czochralski process. The invention specifically relates to the crucible holders (or "susceptors") made of carbon materials used in these devices.

DESCRIPTION OF RELATED ART

The production of microelectronic silicon-based components such as memories and microprocessors uses, as raw material, slices of silicon ingots (commonly called "wafers") cut from monocrystalline silicon ingots. The most frequently used process for the production of these monocrystalline ingots, known as the "Czochralski process", or more simply the "CZ process", essentially comprises pulling a solid ingot from a molten silicon bath.

Many industrial developments have been carried out on this process in order to satisfy the continuously increasing demand for wafers and to improve the perfection of the crystals obtained, which is critical for the efficient manufacture of microelectronic components. CZ pulling equipment according to the state of the art is relatively standardized and comprises essentially a sealed metallic containment (or "oven"), thermal insulation means, heating means, a crucible, and a crucible holder (or "susceptor"). During pulling operations, the crucible contains extremely pure silicon which is molten and then "pulled" as a monocrystal. The crucible is usually made of quartz, so that the silicon does not come into contact with a material containing elements other than silicon and oxygen, which prevents pollution of the molten silicon bath by impurities that would deteriorate the monocrystal quality.

Since the melting temperature of silicon is very high (1430° C.), the quartz crucible must be supported by a crucible holder, since at this temperature quartz no longer has sufficient mechanical strength to support its own weight, and even less the weight of the liquid silicon contained in it. The main function of the crucible holder that forms a sort of external envelope, is to support the crucible while the silicon crystal is being pulled.

For several technical and economic reasons, the crucible holder is usually graphite based. Firstly, the mechanical properties of graphite remain high at the working temperatures normally used. Secondly, it is possible to obtain a graphite that does not contain any metallic impurities that could pollute the molten silicon bath by diffusion. Finally, the cost of the graphite material is competitive.

However, the use of a graphite based crucible holder does create some technical problems. Firstly, since the coefficient of expansion of graphites used is systematically very much greater than the coefficient of expansion of quartz within the range of temperatures at which the mechanical properties of quartz remain high (namely typically from 3 to $6 \times 10^{-6}$ $K^{-1}$ at up to about 1015° C. for the most frequently used graphites and $0.5 \times 10^{-6}$ $K^{-1}$ for quartz), the use of monolithic crucible holders generates high mechanical stresses in the crucible holder and in the crucible during a temperature cycle and frequently destroys one or the other. More precisely, when the temperature of the crucible and the crucible holder is increasing, the crucible expands less than the crucible holder, thus creating a space between these two components; when the temperature reaches values at which the quartz can creep, the crucible deforms and fills the space between the two elements; when the assembly cools (normally after the pulling operation) the graphite contracts, compresses the crucible and deforms it as long as it is in the paste phase (in other words as long as the temperature exceeds about 1015° C.); subsequently during cooling, the crucible becomes very solid and resists contraction of the crucible holder, causing the development of compression stresses on the crucible and tension stresses on the crucible holder. One way of solving this problem that has been known for more than 15 years is to use crucible holders composed of separate parts that may be connected together or assembled in an approximately butt jointed manner. During use, the parts are kept more or less in contact by means of an appropriate support plate that allows slight relative displacement of the parts with respect to each other during pulling cycles. These relative displacements, which are essentially either a relative movement towards or away from each other, absorb expansions of the crucible and the crucible holder. Typically, there are at least three parts.

Furthermore, the high temperatures reached during pulling operations cause chemical reactions in contact areas between the graphite crucible holder and the quartz crucible. In particular, it is observed that the crucible holder is consumed and silicon carbide is produced on the surface of the graphite. Progressive consumption of the crucible holder limits its life and creates deposit of silicon carbide particles that do not adhere well and are released in the form of dust that is harmful to instruments and the quality of silicon crystals. This wear of the crucible holders obliges users to replace them every 30 to 50 pulling cycles.

Therefore, the applicant decided to look for economic and industrially applicable solutions that could prolong the life of crucible holders made of a carbon material, particularly graphite based crucible holders, while maintaining their working properties.

SUMMARY OF THE INVENTION

The purpose of the invention is a crucible holder made of a carbon material, particularly graphite based, designed for crystal pulling operations and including at least two distinct and complementary parts that can be joined together by "junction" surfaces, and characterized in that specific portions of the said junction surfaces overlap when the said parts are brought together to form the crucible holder, thus forming "overlap" areas.

The applicant had the idea that the consumption of the crucible and the production of silicon carbide at the surface of the carbon material could be largely related to the development of openings or interstices between the parts of crucibles according to prior art when they are being used, the said openings or interstices could encourage thermochemical reactions between the silica in the crucible and the carbon in the crucible holder. The applicant put forward the theory that a large proportion of the degradation mechanisms could be assigned to thermochemical reactions that involve the production of carbon oxides by reaction of silica with carbon (such as the $SiO_2 + C \rightarrow SiO + CO$ and $SiO + 2C \rightarrow SiC + CO$ reactions).

The applicant performed tests to verify that the presence of overlap surfaces between parts of the crucible results in a net reduction in the consumption of crucibles and the production of silicon carbide, despite the relative displacements that occur during pulling cycles. The applicant considers that the overlap makes the junction surfaces more impermeable and increases the length of gas diffusion path.

The overlap can limit, and possibly block, gaseous diffusion between the inner and outer surfaces of the crucible holder, such that the thermochemical reactions causing degradation of the crucible holder that introduce gaseous phases become negligible. The applicant also considers that the parts do not separate in practice, or separate very little during pulling cycles, so that the impermeability resulting from the overlap can be maintained.

The invention will be better understood after looking at the figures and reading the following detailed description.

DESCRIPTION OF THE PREFERRED EMBODIMENTS

Figure 1:
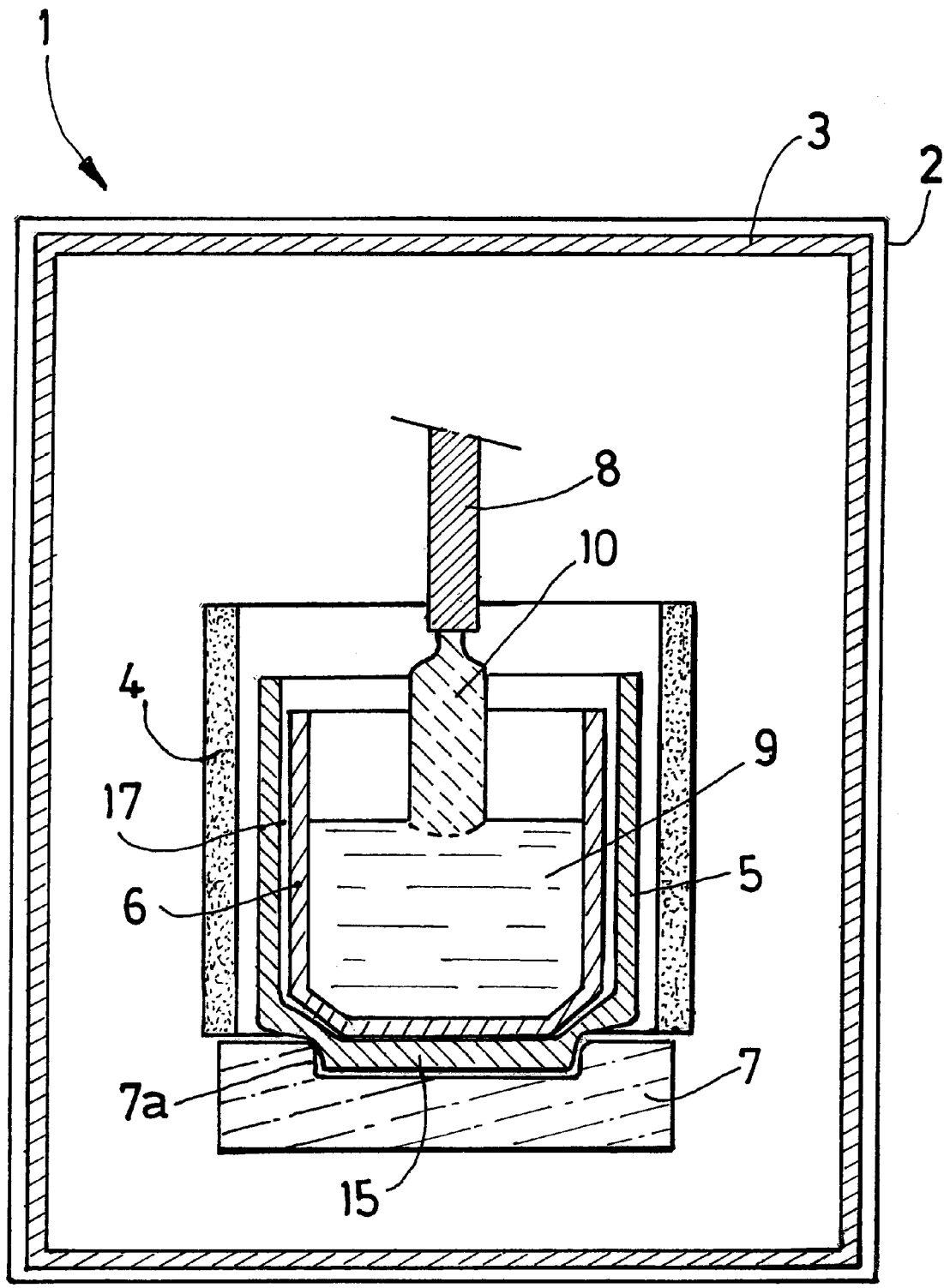
FIG. 1 shows the basic elements of a CZ pulling device (1) according to the state of the art.

As shown in FIG. 1, a CZ pulling device (1) according to the state of the art typically comprises a sealed metallic containment (or "oven") (2), thermal insulation means (3), heating means (4), a crucible holder (or "susceptor") (5), a crucible (6) and pulling means (8). The crucible holder (5) may be supported by a support means (7) adapted to the crucible holder. The crucible (6) can contain silicon (9) to be used for the formation of a monocrystalline ingot (10) by pulling.

Figure 2:
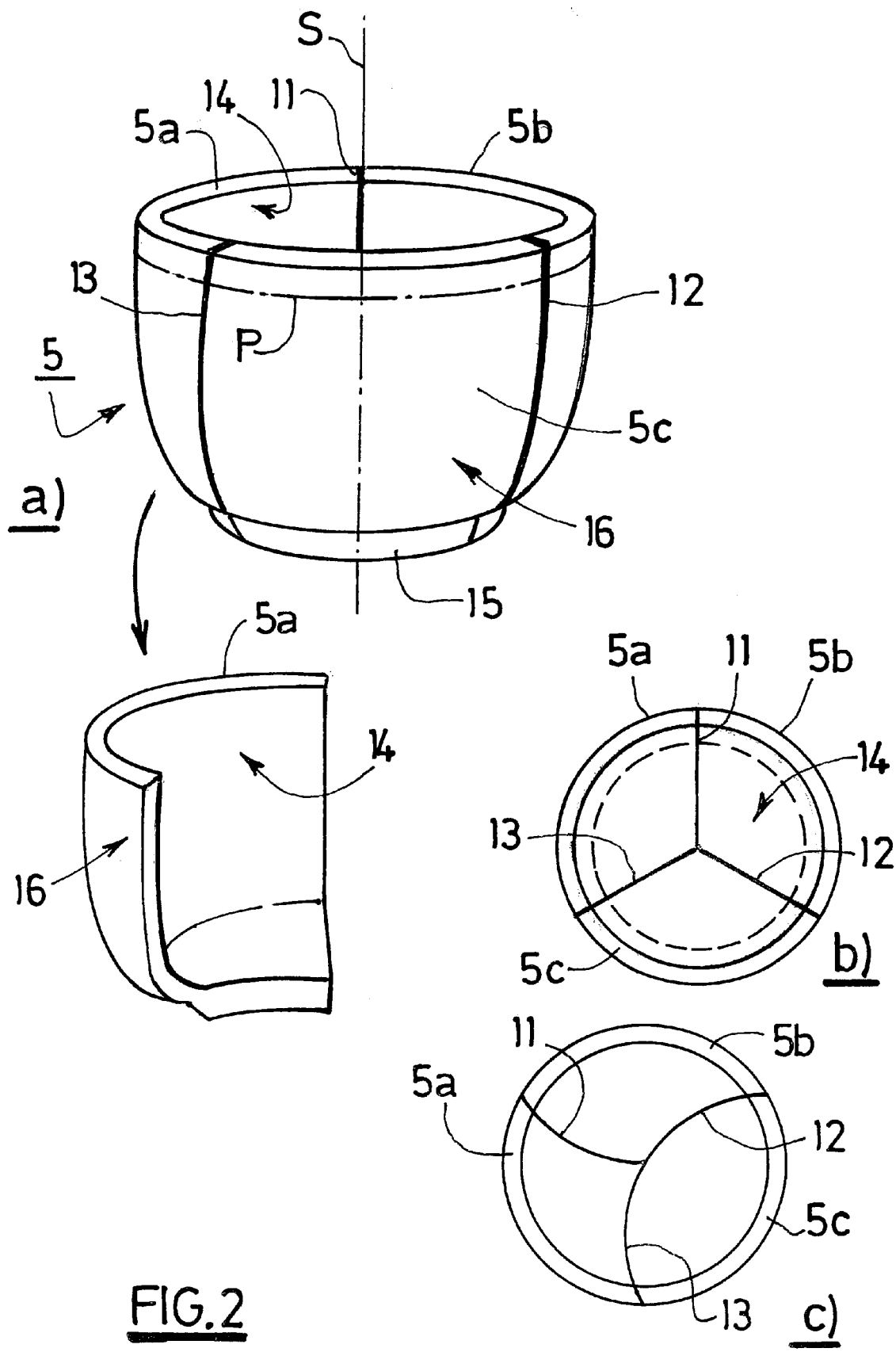
FIG. 2 illustrates a crucible holder according to prior art.

The crucible holder (5) according to prior art illustrated in FIG. 2a is formed of distinct and complementary parts (5a, 5b, 5c). In this case there are three parts (5a, 5b, 5c) that may be identical (FIG. 2b) or different (FIG. 2c). The crucible holder which is in the shape of a receptacle comprises an inner surface (14) and an outer surface (16). When the crucible holder is assembled (in other words when the parts are brought together to form the crucible holder) the parts (5a, 5b, 5c) are essentially butt jointed and define contact surfaces or junction surfaces (11, 12, 13) between them. The parts (5a, 5b, 5c) are kept together using blocking means (7a) usually provided in the support (7); typically, a cavity (7a) in the support (7) with approximately the same shape as the base (15) of the crucible holder (5) cooperates with the assembled parts in order to keep them together, while enabling small relative displacements.

In order to simplify the identification of means according to the invention, marks 70, 80 and 90 collectively denote the different portions of the junction surfaces (51, 52, 53, ...), in other words the specific surfaces of the parts of the crucible holder that can be put into contact when they are brought together in order to form the crucible holder. For example, mark (70) collectively denotes the specific portions (71a, 71b, 72b, 72c, ...). In detail, the junction surfaces are denoted by marks that indicate the part (a to f) and the corresponding junction surface (1 to 9). For example, the portion of surface 72b is located on part 50b and relates to the junction surface 52 between parts 50b and 50e. Similarly, overlap surfaces (101–106, 101'–106') may be denoted collectively as reference (100).

With reference to the figures, the crucible holder made of a carbon material according to the invention (50), that will be used for crystal pulling operations and which is in the shape of a hollow receptacle including an inner surface (14) and an outer surface (16), includes at least two distinct and complementary parts (50a to 50f), that can be brought together by junction surfaces (51, 52, 53, ..., 59) and is characterized in that the said parts (50a–50f) overlap to form the said crucible holder, specific portions (71a, 71b, 72b, 72c, ...) of the said junction surfaces (51, 52, 53, ..., 59) overlapping to form at least one "overlap" area (101–106, 101'–106').

The carbon material is preferably graphite, the said graphite can be used in different forms such as extruded graphite, or graphite obtained by isostatic compression. Other carbon materials can also be used for the different parts. Preferably, at least one of the said parts (50a to 50f) is made of graphite.

In practice, each part (50a to 50f) includes junction patterns which may be complementary, which enable assembly of parts in order to form a crucible holder (50) and which possess specific surface portions (71a, 71b, 72b, 72c, ...) designed to form overlap surfaces (101–106, 101'–106'), the area of which may vary during use.

When the parts (50a to 50f) are brought together (or assembled) to form the crucible holder, the said portions (71a, 71b, 72b, 72c, ...) cooperate in order to form overlap surfaces (100) suitable for maintaining a sealed (tight) contact surface between the said parts when they move with respect to each other, particularly during pulling operations. The parts (50a to 50f) are kept together using blocking means (7a) that are generally provided in the support (7) and means (7a) that typically include a cavity (7a) in the support (7), the said cavity being approximately the same shape as the base (15) of the crucible holder (50) and cooperates with the assembled parts in order to keep them together while enabling small relative displacements. The relative displacements of the parts of the crucible holder may consist of relative movements either towards or away from each other. These relative displacements or movements are due particularly to thermal expansions and stresses caused by the thrust exerted on the crucible, which tends to separate parts of the crucible holder, and have a small amplitude, usually less than 1% of the main external perimeter P. For example, with graphite crucible holders and quartz crucibles, the amplitude of the displacements is about 0.1 to 0.5% of the perimeter P. In this case, the expression "main external perimeter P" denotes the length of the main external perimeter (or contour) of the crucible, which is usually located in the upper part of the crucible holder and which is symmetrical about the axis of symmetry S of the crucible holder.

The initial overlap surfaces between the parts of the crucible holder (in other words the overlap surfaces obtained when the parts are brought together) are such that, when relative displacements of parts occur during pulling operations, the parts can keep some surfaces in contact (without separating), preferably at least close to the locations (17) at which the crucible and the crucible holder can touch each other.

According to the invention, the area of the overlap surface (100) between the parts of the crucible holder is usually equal to a fraction of the area of the internal surface (14) of the crucible holder. Within the framework of the invention, it is simply necessary to have an overlap that allows relative displacements of the order of magnitude of the thermal expansions of the parts and the crucible and creep deformations of the crucible, namely typically overlap surfaces of the order of 0.5 to 1% of the total inner (14) or outer (16) surface area of the crucible holder. For practical reasons, for example in order to facilitate assembly of the parts, it may be necessary to allow larger overlap surfaces, in other words at least 1%, that typically remain less than 10% of the inner or outer surface areas of the crucible holder, but which may be much higher. Preferably, the area of the said overlap zones (101–106, 101'–106') is equal to at least 1% of the said inner surface area (14).

The crucible holders (and correspondingly the crucibles) usually have a circular cross section, although many other forms would be possible within the framework of the invention. In the case of circular crucible holders, the main external perimeter P is approximately equal to the circumference of the circle formed by the intersection of the outer surface of the crucible holder and the plane transverse to the axis of symmetry S of the crucible holder located in its upper part (see FIGS. 3 and 5).

Figure 3:
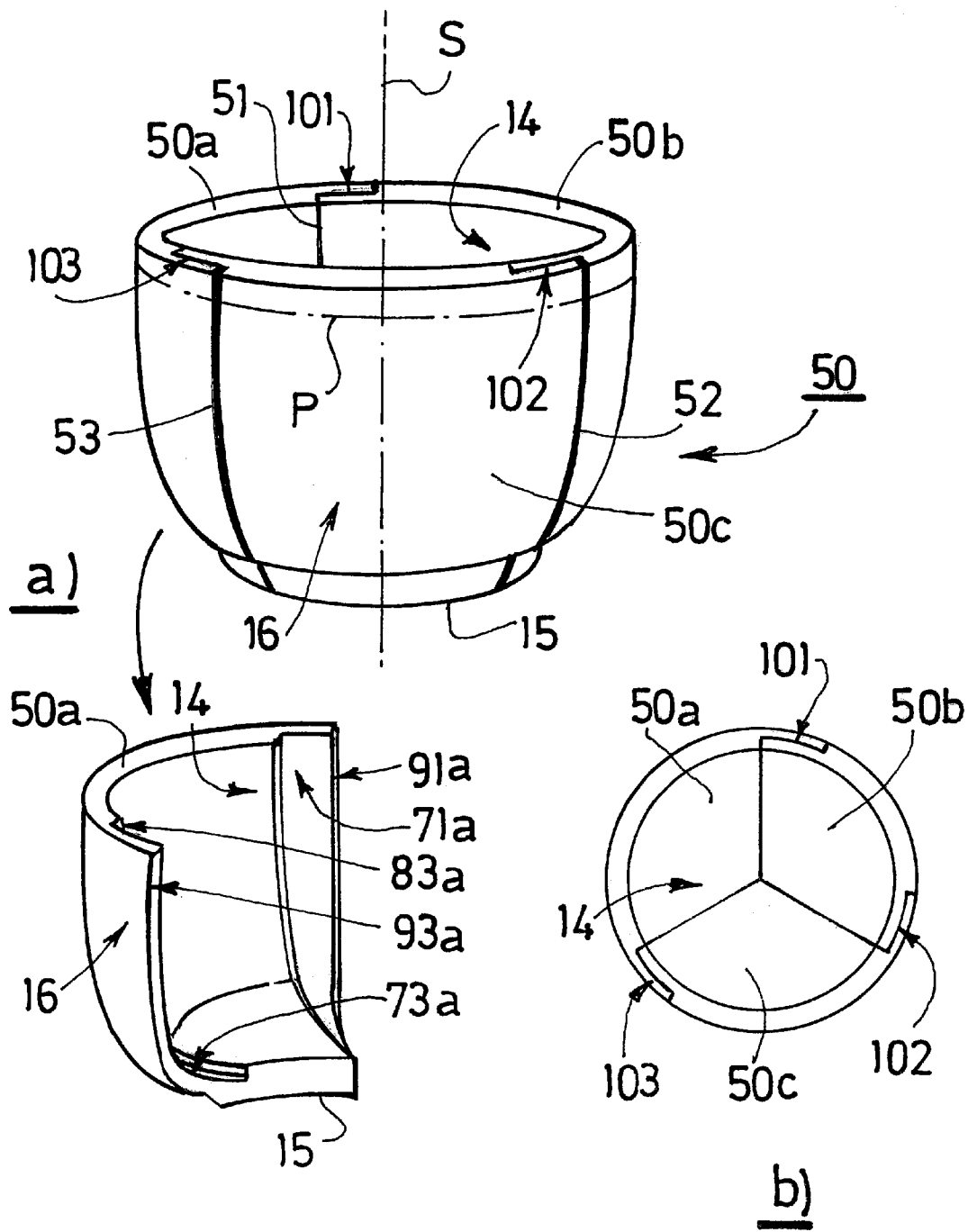
FIG. 3 illustrates a crucible holder (50) according to the invention: a) perspective view; b) top view; c) exploded cross-sectional view.
Figure 3:
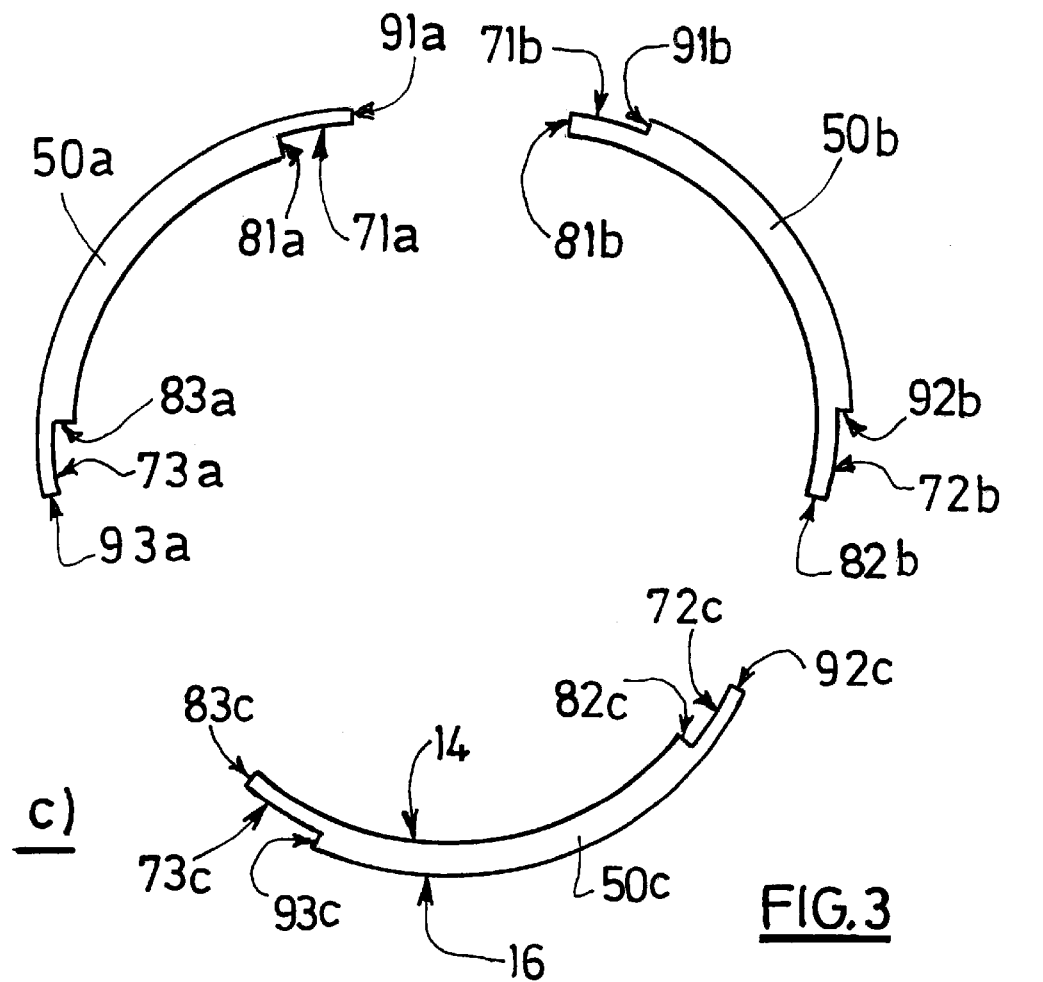
Figure 4:
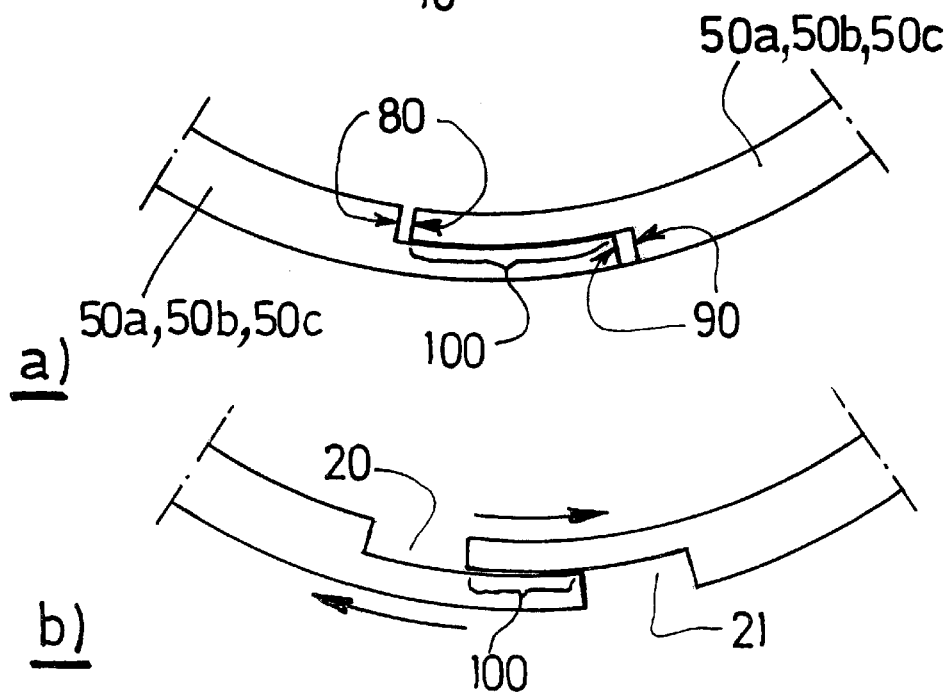
FIG. 4 is a simplified cross-sectional view of an overlap area between parts of a crucible holder according to the embodiment of the invention shown in FIG. 3.
Figure 5:
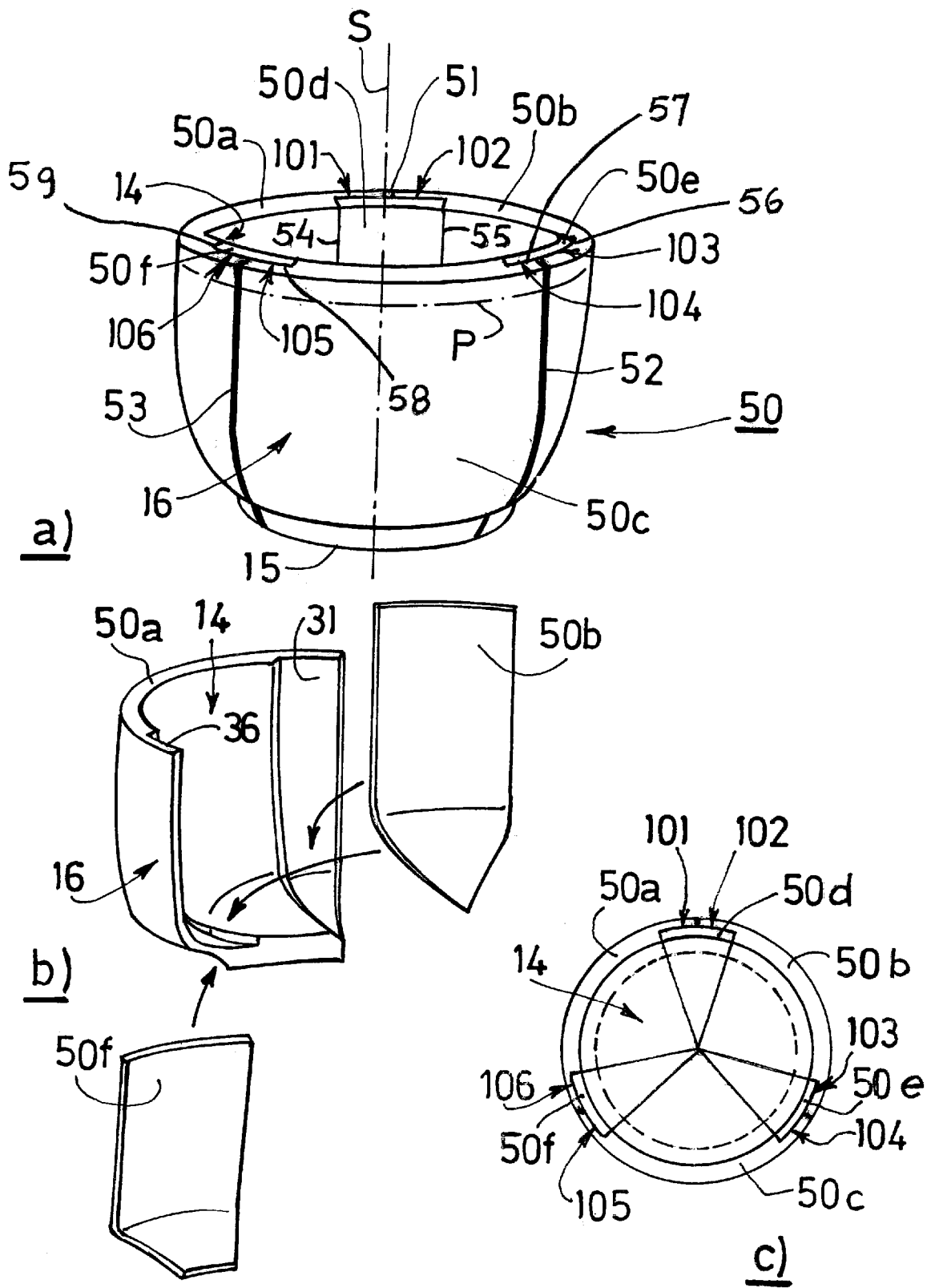
FIG. 5 illustrates a crucible holder (50) according a variant of the invention: a) perspective view; b) partial exploded and partial perspective view; c) top view; d) exploded cross-sectional view.
Figure 5:
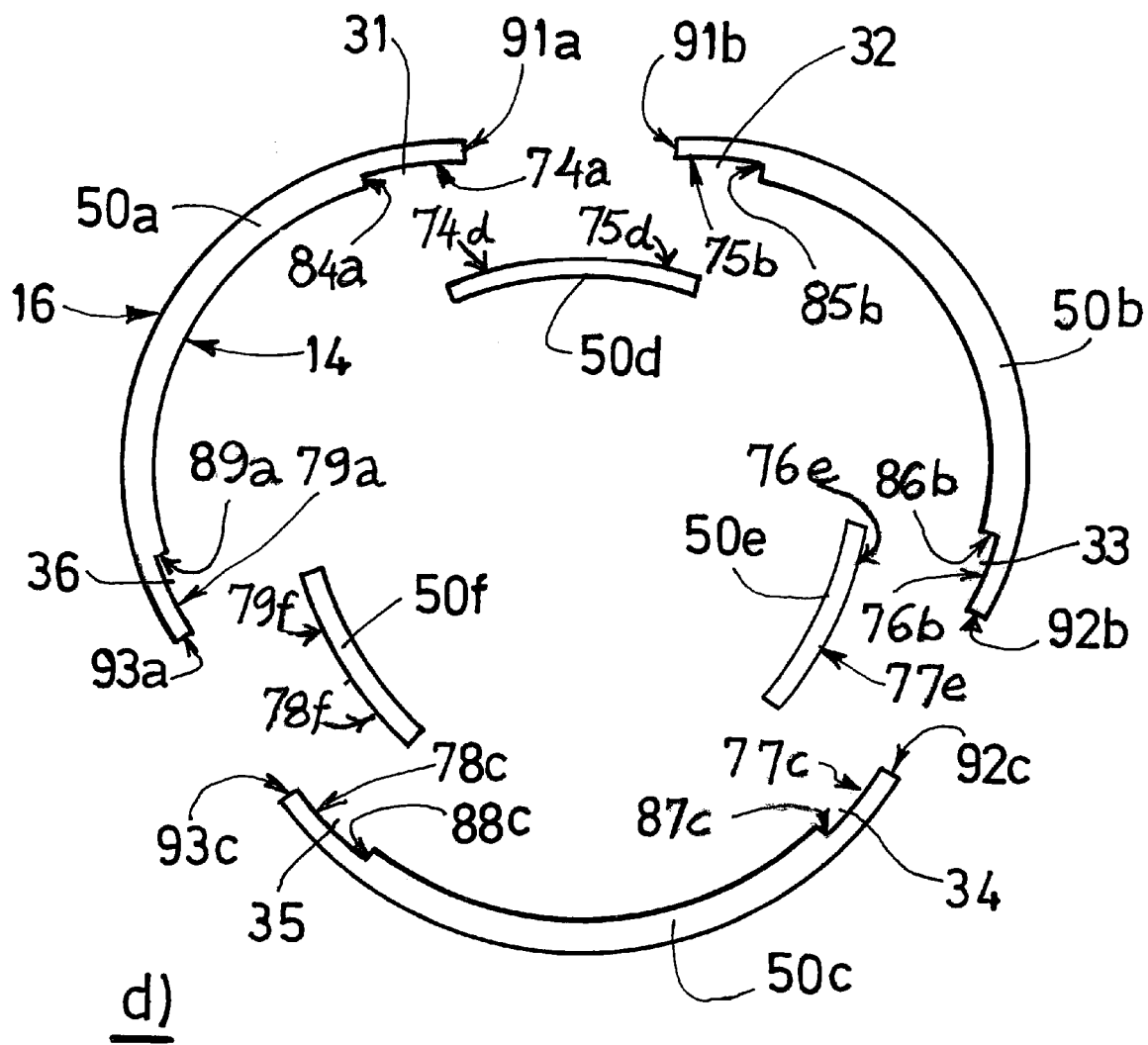
Figure 6:
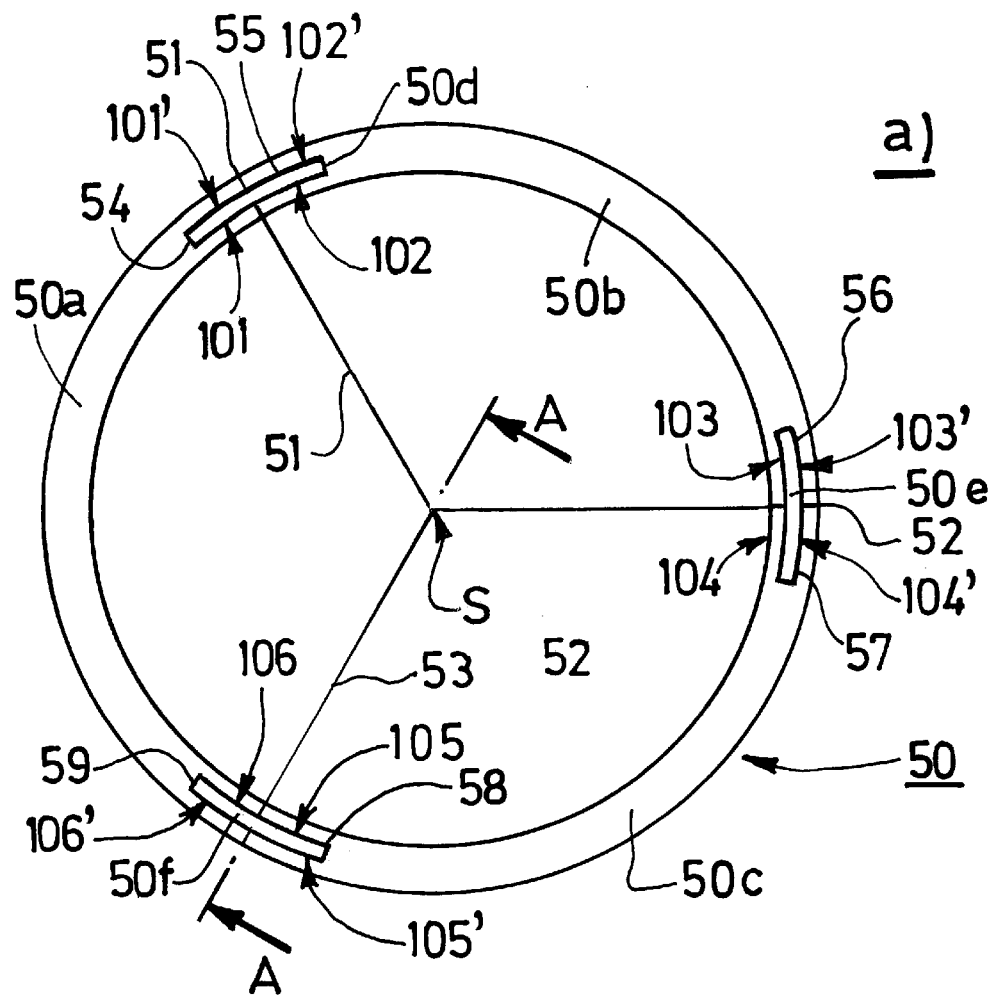
FIG. 6 illustrates one advantageous embodiment of the crucible holder (50) according to the invention shown in FIG. 5; a) top view; b) half-sectional view along plane A—A passing through the S axis; c) exploded cross-sectional view.
Figure 6:
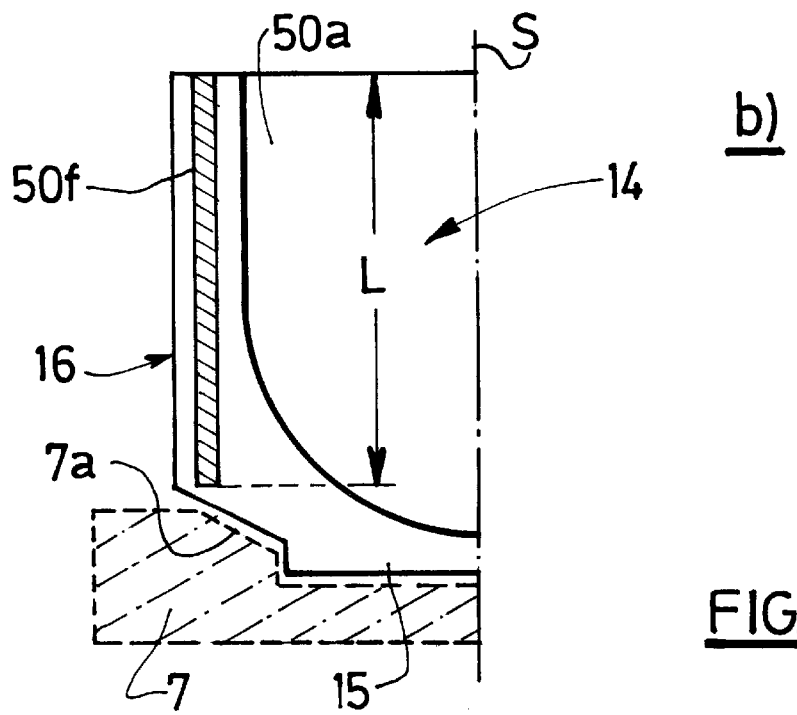
Figure 6:
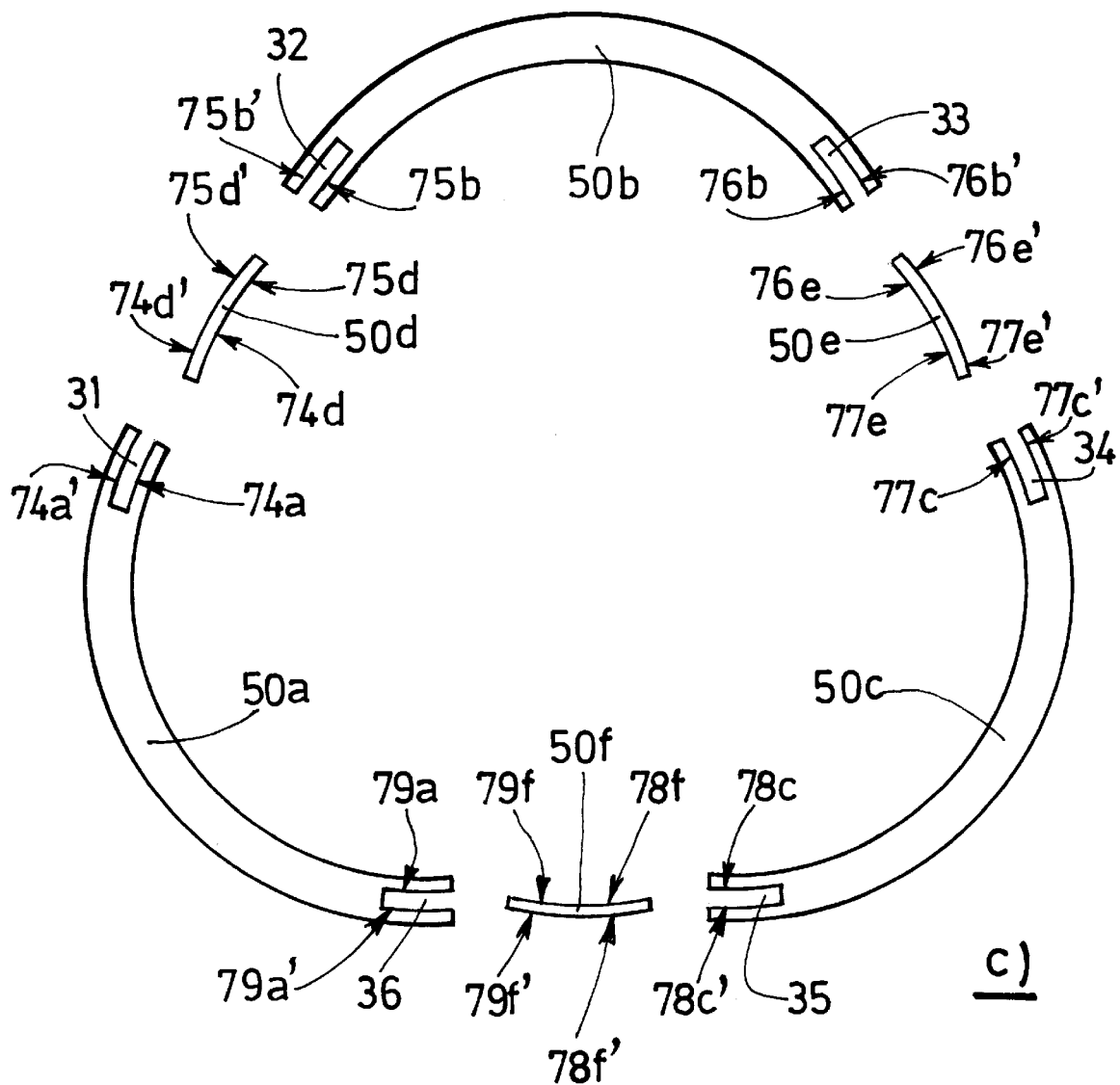

FIG. 4 illustrates how the embodiment shown in FIG. 3 operates (which is similar to the operation of the embodiment in FIGS. 5 and 6). In the initial position, in other words when parts are assembled to form the crucible holder, the parts have initial overlap surfaces (100) (FIG. 4a). The parts do not need to be perfectly butt jointed at all points on the junction surfaces. For example, some parts of the contact surfaces (such as 80 and 90) may not to be butt jointed. According to the invention, the dimensions and geometry of parts in contact are such that during use (in other words during pulling cycles) the parts can move with respect to each other by an amplitude A (which is typically less than or equal to 1%) while maintaining a contact area between the parts, even if these displacements usually cause separation of parts that may initially have been in contact (80, 90) and reduce the surface area of the overlap surfaces (100) (FIG. 4b), or possibly create a slight separation of surfaces in contact in the overlap surfaces (100). Spaces (20, 21) between the theoretical contact surfaces can develop during use, provided that the overlap surfaces (100) are maintained.

The said portions of the specific surfaces (70) forming the overlap areas are preferably approximately along the azimuth, in other words approximately perpendicular to the direction normal to the inner surface (14) of the crucible holder, which corresponds to the radial direction in the case of a symmetrical cylindrical crucible holder (as illustrated in FIGS. 3, 5 and 6).

In the embodiment of the invention shown in FIG. 3, the portions of the specific surfaces (70) which will form overlap surfaces (100) occupy a small fraction of the inner or outer surface of the parts. These specific surfaces (70) are approximately along the azimuth direction with respect to the axis of symmetry of the crucible holder, in the sense that they are approximately along the lines of arcs of circles, although this configuration is a preferred but non-restrictive choice. The parts (there are three in this example) are different from each other, but identical parts could also be made in order to simplify the manufacturing process and stock management.

In the embodiments of the invention shown in FIGS. 5a–5d and 6, there are two different types of parts (there are six in this example), namely shape parts (50a, 50b, 50c) and sealing parts (or "flaps") (50d, 50c, 50f). The overlap surfaces represent a small fraction of the inner and outer surface of the first parts (50a, 50b, 50c) and essentially the entire inner and/or outer surface of the second parts (50d, 50e, 50f). The flaps (50d, 50e, 50f) may be placed on the shape parts (5a, 50b, 50c) (FIG. 5b–5c), or may be inserted in them (FIG. 6c), by inserting them in recesses (or "countersinking") (31 to 36) provided for this purpose in the shape parts. More specifically, when the crucible holder is assembled, the sealing parts (50d, 50e, 50f) are inserted in the recesses (31 to 36) so as to form overlap surfaces (100) capable of maintaining an sealed contact surface between the said parts (50a to 50f) despite relative movements between the said parts. Shape parts are essentially butt jointed with each other. The specific surfaces (70) designed to form overlap surfaces (100) are also preferably approximately along the azimuth with respect to the access of symmetry of the crucible holder, although this configuration is a preferred but not a limitative choice. This embodiment has the advantage that shape parts may be obtained from the same cylinder of carbon material. The flaps may be composed of a material different from the shape parts, such as a different type of graphite, a flexible graphite, a carbon/carbon composite or any refractory material compatible with crystal pulling processes in which the crucible holder could be used. Typically, shape parts may be made of graphite and sealing parts may be made of either graphite or a carbon/carbon (C/C) composite. The flaps could be fixed, for example using screws, to the shape parts in order to simplify the assembly of parts before use (for example one flap may be fixed to each shape part).

The embodiment shown in FIGS. 6a–6b, in which the flaps (50d, 50e, 50f) are in the form of inserts, has the advantage that it simplifies manufacture of the crucible holder because there is no need for the flaps to match the inner or outer shape of the crucible holder. For example, as shown in FIG. 6b, the shape of the flaps may be approximately straight along their length. This embodiment also has the advantage that in some cases it increases the mechanical strength of the assembly. In the preferred variant of the embodiment shown in FIGS. 6a–6b, the flaps (50d, 50e, 50f) are preferably straight and have an approximately uniform rectangular cross section over their entire length L, in other words they are in the shape of a parallelepiped, which considerably simplifies the manufacture of the flaps and the corresponding recesses. In this variant, the shape of the corresponding part of the recesses (31 to 36) is preferably a parallelepiped, which also simplifies manufacture.

The said determined portions (71a, 71b, 72b, 72c, ...) are preferably located at least close to the area (17) where the crucible (6) may touch the crucible holder (50). In the embodiment shown in FIGS. 5 and 6, the flaps may cover only part of the junction surfaces between the parts. For example, as illustrated in FIG. 6b, a flap may cover only the part of the junction surface that is not in contact with the support (7).

Another subject of the invention is parts made of a carbon material suitable for forming a crucible holder according to the invention.

Another subject of the invention is the use of a crucible holder (50) according to the invention to implement a crystal pulling process, particularly a Czochralski process.

EXAMPLE 1

A crucible holder as illustrated in FIG. 3 was made from graphite. The junction patterns were made by machining base parts. This crucible holder was tested in a CZ pulling device and was used satisfactorily for 70 pulling operations, whereas the average life of crucible holders made of several parts according to prior art in the same type of device with the same quality of graphite is only 40.

EXAMPLE 2

A crucible holder as illustrated in FIG. 5 was made from graphite. The junction patterns were also made by machining the base parts. This crucible holder was tested in a CZ pulling device and was used satisfactorily for 65 pulling operations without any sign of local wear.

Advantages

This invention provides a simple solution to the problem of deterioration of crucible holders during use in crystal pulling operations.

What is claimed is:

1. A crucible holder for use in crystal pulling, made of a carbon material and shaped as a hollow receptacle including an inner surface, an outer surface and a generally vertical wall of defined thickness and height, the crucible holder being divided into at least two separable and complementary parts, each said part including two opposed, generally vertical edge portions, each said edge portion abutting an edge portion of an adjacent part, wherein each said edge portion has a reduced thickness defining a shoulder portion adjacent either the outer surface or the inner surface, and wherein an edge portion with shoulder adjacent the inner surface of a first part overlaps an edge portion with shoulder adjacent the outer surface of an adjacent part, the overlapping edge portions forming together a wall portion having substantially the defined thickness.

2. A crucible holder according to claim 1, wherein at least one of said parts is made of graphite.

3. A crucible holder according to claim 1, wherein the overlapping portions have an area equal to at least 1% of the inner surface of the crucible holder.

4. A crucible holder according to claim 1, wherein the defined wall thickness also varies over the wall height.

5. A crucible holder for use in crystal pulling, made of a carbon material and shaped as a hollow receptacle including an inner surface, an outer surface and a generally vertical wall of defined thickness and height, the crucible holder being divided into at least two separable and complementary parts, each said part including two opposed, generally vertical edge portions, each said edge portion abutting an edge portion of an adjacent part, wherein each said edge portion has a reduced thickness defining a shoulder portion adjacent either the outer surface or the inner surface and along the height of the wall substantially in its entirety, and wherein adjacent portions of reduced thickness are butt jointed, said crucible holder further comprising a flap portion extending between the adjacent shoulders of the butt jointed portions, and completing the wall of the crucible holder of the defined thickness over the wall height substantially in its entirety therebetween.

6. A crucible holder according to claim 5, wherein at least one of said parts is made of graphite.

7. A crucible holder according to claim 5, wherein the overlapping portions have an area equal to at least 1% of the inner surface of the crucible holder.

8. A crucible holder according to claim 5, wherein the defined wall thickness also varies over the wall height.

9. A crucible holder for use in crystal pulling, made of a carbon material and shaped as a hollow receptacle including an inner surface, an outer surface and a generally vertical wall of defined thickness and height, the crucible holder being divided into at least two separable and complementary parts, each said part including two opposed, generally vertical edge portions, each said edge portion abutting an edge portion of an adjacent part, wherein each said edge portion has a recess between the inner and outer surfaces along the height of the wall substantially in its entirety, and wherein adjacent portions of reduced thickness are butt jointed with the recesses joined together, said crucible holder further comprising a flap portion disposed within the joined recesses, and completing the wall of the crucible holder of the defined thickness over the wall height substantially in its entirety.

10. The crucible holder according to claim 9, wherein the flap portion is parallelepiped in shape.

11. The crucible holder according to claim 10, wherein the recesses are parallelepiped in shape.

12. A crucible holder according to claim 9, wherein at least one of said parts is made of graphite.

13. A crucible holder according to claim 9, wherein the overlapping portions have an area equal to at least 1% of the inner surface of the crucible holder.

14. A crucible holder according to claim 9, wherein the defined wall thickness also varies over the wall height.

15. A part for a crucible holder for use in crystal pulling, and shaped as a hollow receptacle, the part comprising a portion of the crucible holder divided into at least two separable and complementary parts, and being made of a carbon material and including an inner surface, an outer surface and a generally vertical wall of defined thickness, the part including two opposed, generally vertical edge portions, each said edge portions constructed and arranged to abut an edge portion of an adjacent part, wherein each said edge portion has either
1) a reduced thickness over substantially its entire height defining a shoulder portion adjacent either the outer surface or the inner surface, or
2) a recess between the inner and outer surfaces.

16. A part according to claim 15, which is made of graphite.

* * * * *